United States Patent
Cho et al.

(10) Patent No.: US 10,308,842 B2
(45) Date of Patent: *Jun. 4, 2019

(54) PRESSURE-SENSITIVE ADHESIVE COMPOSITION, PRESSURE-SENSITIVE ADHESIVE FILM, AND METHOD OF MANUFACTURING ORGANIC ELECTRONIC DEVICE USING THE SAME

(71) Applicant: LG CHEM, LTD., Seoul (KR)

(72) Inventors: Yoon Gyung Cho, Daejeon (KR); Kyung Yul Bae, Daejeon (KR); Min Soo Park, Daejeon (KR); Jung Sup Shim, Daejeon (KR); Hyun Jee Yoo, Daejeon (KR)

(73) Assignee: LG CHEM LTD., Seoul (KR)

( * ) Notice: Subject to any disclaimer, the term of this patent is extended or adjusted under 35 U.S.C. 154(b) by 638 days.

This patent is subject to a terminal disclaimer.

(21) Appl. No.: 14/765,482

(22) PCT Filed: Aug. 5, 2014

(86) PCT No.: PCT/KR2014/007236
§ 371 (c)(1),
(2) Date: Aug. 3, 2015

(87) PCT Pub. No.: WO2015/020408
PCT Pub. Date: Feb. 12, 2015

(65) Prior Publication Data
US 2015/0376468 A1 Dec. 31, 2015

(30) Foreign Application Priority Data
Aug. 5, 2013 (KR) .................. 10-2013-0092782
Apr. 4, 2014 (KR) .................. 10-2014-0040827

(51) Int. Cl.
*C09J 123/22* (2006.01)
*C09J 109/00* (2006.01)
*H01L 51/00* (2006.01)
*H01L 51/56* (2006.01)
*H01L 51/52* (2006.01)
*C09J 9/00* (2006.01)
*C09J 4/00* (2006.01)
*C09J 7/00* (2018.01)
*C09J 133/08* (2006.01)
*C09J 145/00* (2006.01)
*C09J 7/20* (2018.01)
*C09J 7/10* (2018.01)

(52) U.S. Cl.
CPC .............. *C09J 109/00* (2013.01); *C09J 4/00* (2013.01); *C09J 7/00* (2013.01); *C09J 7/10* (2018.01); *C09J 7/20* (2018.01); *C09J 9/00* (2013.01); *C09J 123/22* (2013.01); *C09J 133/08* (2013.01); *C09J 145/00* (2013.01); *H01L 51/0001* (2013.01); *H01L 51/004* (2013.01); *H01L 51/0026* (2013.01); *H01L 51/0043* (2013.01); *H01L 51/0094* (2013.01); *H01L 51/5237* (2013.01); *H01L 51/5246* (2013.01); *H01L 51/5253* (2013.01); *H01L 51/5256* (2013.01); *H01L 51/5259* (2013.01); *H01L 51/56* (2013.01); *C09J 2201/36* (2013.01); *C09J 2201/606* (2013.01); *C09J 2203/326* (2013.01); *C09J 2205/114* (2013.01); *C09J 2409/00* (2013.01); *C09J 2415/003* (2013.01); *C09J 2423/00* (2013.01); *C09J 2423/003* (2013.01); *C09J 2433/003* (2013.01); *Y10T 428/2883* (2015.01)

(58) Field of Classification Search
None
See application file for complete search history.

(56) References Cited

U.S. PATENT DOCUMENTS

| | | | |
|---|---|---|---|
| 9,698,374 B2 * | 7/2017 | Lee | C09J 123/22 |
| 9,803,112 B2 * | 10/2017 | Yoo | C09J 7/20 |
| 2003/0130427 A1 * | 7/2003 | Cleary | A61K 9/7053 525/192 |
| 2005/0121665 A1 * | 6/2005 | Gillissen | C08F 290/067 257/40 |
| 2006/0100299 A1 * | 5/2006 | Malik | C08G 59/18 522/31 |
| 2011/0030756 A1 * | 2/2011 | Honda | H01L 31/048 136/244 |
| 2011/0073901 A1 | 3/2011 | Fujita et al. | |
| 2011/0105637 A1 * | 5/2011 | Fujita | C08L 23/22 522/120 |
| 2011/0272827 A1 | 11/2011 | Blizzard et al. | |
| 2013/0280529 A1 | 10/2013 | Toyama et al. | |
| 2014/0091296 A1 | 4/2014 | Yoo et al. | |
| 2014/0217621 A1 * | 8/2014 | Yoo | B32B 3/04 257/788 |
| 2014/0322526 A1 | 10/2014 | Dollase et al. | |
| 2015/0188085 A1 | 7/2015 | Yoo et al. | |
| 2015/0299523 A1 * | 10/2015 | Park | C09J 7/20 428/354 |
| 2015/0368523 A1 * | 12/2015 | Bae | C09J 7/20 428/355 BL |
| 2015/0376469 A1 * | 12/2015 | Bae | C09J 7/20 257/40 |
| 2016/0046841 A1 * | 2/2016 | Cho | C09J 7/20 257/40 |
| 2017/0222183 A1 * | 8/2017 | Cho | H01L 51/5246 |

FOREIGN PATENT DOCUMENTS

| | | | |
|---|---|---|---|
| CN | 101516617 A | 8/2009 | |
| EP | 2610319 A1 | 7/2013 | |

(Continued)

*Primary Examiner* — Anish P Desai
(74) *Attorney, Agent, or Firm* — Dentons US LLP

(57) ABSTRACT

Provided are a pressure-sensitive adhesive composition, a pressure-sensitive adhesive film, and a method of manufacturing an organic electronic device using the same. The pressure-sensitive adhesive composition that may effectively block moisture or oxygen penetrated into an organic electronic device from an external environment, and exhibit reliability under harsh conditions such as high temperature and high humidity and excellent optical characteristics, and a pressure-sensitive adhesive film including the same are provided.

11 Claims, 2 Drawing Sheets

(56) References Cited

FOREIGN PATENT DOCUMENTS

| | | | |
|---|---|---|---|
| EP | 2274394 | B1 | 11/2014 |
| EP | 2801476 | A1 | 11/2014 |
| EP | 2889656 | A1 | 7/2015 |
| JP | 60-092343 | A | 5/1985 |
| JP | 10-46125 | A | 2/1998 |
| JP | 2004-105369 | A | 4/2004 |
| JP | 2004-307579 | A | 11/2004 |
| JP | 2005-261453 | A | 9/2005 |
| JP | 2007-262309 | A | 10/2007 |
| JP | 2011-522063 | A | 7/2011 |
| JP | 2011-526052 | A | 9/2011 |
| JP | 2011-236298 | A | 11/2011 |
| JP | 2012-140578 | A | 7/2012 |
| JP | 2012-140579 | A | 7/2012 |
| JP | 2013-75978 | A | 4/2013 |
| KR | 10-2008-088606 | A | 10/2008 |
| KR | 10-2010-0075723 | A | 7/2010 |
| KR | 10-2013-0023183 | A | 3/2013 |
| KR | 20130063938 | A | 6/2013 |
| KR | 10-2013-0081261 | A | 7/2013 |
| TW | 201002796 | A1 | 1/2010 |
| WO | 2006/107748 | A1 | 10/2006 |
| WO | 2007/111607 | A1 | 10/2007 |
| WO | 2008/144080 | A1 | 11/2008 |
| WO | 2012/081542 | A1 | 6/2012 |
| WO | 2013028047 | A2 | 2/2013 |
| WO | 2013/057264 | A1 | 4/2013 |
| WO | 2013/073846 | A1 | 5/2013 |
| WO | 2013/103281 | A1 | 7/2013 |
| WO | 2013/103283 | A1 | 7/2013 |
| WO | 2015/129625 | A1 | 9/2015 |

\* cited by examiner

PRESSURE-SENSITIVE ADHESIVE COMPOSITION, PRESSURE-SENSITIVE ADHESIVE FILM, AND METHOD OF MANUFACTURING ORGANIC ELECTRONIC DEVICE USING THE SAME

This application is a National Stage Entry of International Application No. PCT/KR2014/007236, filed Aug. 5, 2014, and claims the benefit of Korean Application No. 10-2013-0092782, filed on Aug. 5, 2013, and Korean Application No. 10-2014-0040827, filed Apr. 4, 2014, all of which are hereby incorporated by reference in their entirety for all purposes as if fully set forth herein.

BACKGROUND

1. Field of the Invention

The present invention relates to a pressure-sensitive adhesive composition, a pressure-sensitive adhesive film, and a method of manufacturing an organic electronic device using the same.

2. Discussion of Related Art

An organic electronic device (OED) refers to a device including an organic material layer generating alternation of charges using holes and electrons, and may include, for example, a photovoltaic device, a rectifier, a transmitter, and an organic light emitting diode (OLED).

A representative OED, which is an OLED, has less power consumption and a higher response speed, and forms a thinner display device or light than a conventional light source. In addition, the OLED has excellent space utilization, and is expected to be applied in various fields including all kinds of portable devices, monitors, notebook computers, and TVs.

To extend commercialization and use of the OLED, a major problem is durability. Organic materials and metal electrodes included in the OLED are very easily oxidized by external factors such as water. Accordingly, a product including the OLED is very sensitive to environmental factors. Therefore, various methods for preventing penetration of oxygen or water from an external environment with respect to an organic electronic device such as the OLED have been suggested.

In Korean Unexamined Patent No. 2008-0088606, an adhesive capsulated composition and an organic electroluminescence light emitting device are provided, and have poor processability as a pressure-sensitive adhesive based on polyisobutylene (PIB), and low reliability at high temperature and high humidity.

Accordingly, in an organic electronic device, it is required to develop an encapsulant ensuring a required life span, excellently preventing penetration of moisture, maintaining reliability at high temperature and high humidity, and having excellent optical characteristics.

SUMMARY OF THE INVENTION

The present invention is directed to providing a pressure-sensitive adhesive composition which can form a structure effectively preventing moisture or oxygen penetrated into an organic electronic device from an external environment, and has excellent mechanical characteristics such as handleability and processability and excellent transparency, a pressure-sensitive adhesive film, and a method of manufacturing an organic electronic device using the same.

In one aspect, the present invention provides a pressure-sensitive adhesive composition. The pressure-sensitive adhesive composition may be applied to, for example, encapsulation or capsulation of an organic electronic device such as an OLED.

The term "organic electronic device" used herein refers to a product or device having a structure including an organic material layer generating alternation of charges using holes and electrons between a pair of electrodes facing each other, and may include, but is not limited to, for example, a photovoltaic device, a rectifier, a transmitter, and an organic light emitting diode (OLED). In one example, the organic electronic device may be an OLED.

The pressure-sensitive adhesive composition of the present invention may have a gel content represented by Equation 1 of 50% or more, and a micro gel content represented by Equation 2 of 3% or less.

$$\text{Gel content (wt \%)} = B/A \times 100 \quad \text{[Equation 1]}$$

$$\text{Micro gel content (wt \%)} = C/A \times 100 \quad \text{[Equation 2]}$$

In Equation 1, A is a mass of the pressure-sensitive adhesive composition, and B is a dry mass of an insoluble content of the pressure-sensitive adhesive composition remaining after being dipped in toluene at 60° C. for 24 hours and filtered through a 200-mesh sieve (pore size of 200 μm).

Also in Equation 2, A is a mass of the pressure-sensitive adhesive composition, and C is a dry mass of an insoluble content of the pressure-sensitive adhesive composition remaining after being dipped in toluene at 60° C. for 24 hours, primarily filtered through a 200-mesh sieve (pore size: 200 μm), and secondarily filtered through a 1000-mesh sieve (pore size: 5 μm).

The gel content represented by Equation 1 may be 50 to 99%, 50 to 90%, 50 to 80%, or 50 to 70%. In addition, the micro gel content represented by Equation 2 may be 3%, 2%, 1%, 0.8%, or 0.5% or less. Here, the lower limit is not particularly limited, and may be 0%. When the micro gel content is 0%, the pressure-sensitive adhesive composition may secondarily be filtered through a 1000-mesh sieve (pore size: 5 μm), and a dry mass of the pressure-sensitive adhesive composition remaining after filtering may be 0. In addition, the micro gel may be identified using a syringe having a size of 5 μm. For example, when the pressure-sensitive adhesive composition is primarily filtered through a 200-mesh sieve (pore size: 200 μm) and the filtered solution passes using a syringe having a size of 5 μm, the syringe is clogged with a micro gel (having a size of approximately 100 nm to 20 μm) present in a composition having a micro gel content represented by Equation 2 of more than 3%, and therefore the composition does not pass. On the other hand, when almost no or no micro gel is present in the crosslinking structure, the composition passes through the syringe, and has a micro gel content of within 3% (actually, close to almost 0%) represented by Equation 2. In addition, the presence of an actual micro gel may be confirmed through morphological analysis. The micro gel observed through the morphological analysis may have a size of approximately 100 nm to 20 μm. The syringe may be any one that has a size of 5 μm without particular limitation, and thus may be a micro filter generally used in the art.

That is, the micro gel content represented by Equation 2 is a value with respect to a sol component that does not pass through or remaining after the pressure-sensitive adhesive composition is dipped in toluene at 60° C. for 24 hours and filtered through a 1000-mesh sieve (pore size: 5 μm), which may determine the presence of a micro gel in the pressure-sensitive adhesive composition, and therefore becoming an indicator that can realize desired reliability and optical characteristics. That is, it is not enough to determine a crosslinking structure and a degree of crosslinking only with the conventional gel content, and thus suitable ranges of the crosslinking structure and degree of crosslinking of a pressure-sensitive adhesive composition are determined using a micro gel content, thereby realizing a pressure-sensitive adhesive composition having excellent moisture barrier ability, reliability, and optical characteristic.

The pressure-sensitive adhesive composition may have a water vapor transmission rate (WVTR) measured in a thickness direction of the film while being formed in a film having a thickness of 100 μm of 50, 40, 30, 20, or 10 g/m²·day or less at 100° F. and a relative humidity of 100%. By controlling a composition or crosslinking condition of a pressure-sensitive adhesive composition to have such a WVTR, an encapsulation or capsulation structure which can stably protect an element by effectively blocking moisture or oxygen penetrated from an external environment when being applied to an encapsulation or capsulation structure of an electronic device may be realized. The lower WVTR, the better moisture barrier ability, and therefore the lower limit of the WVTR may be, but is not particularly limited to, 0 g/m²·day.

In addition, the pressure-sensitive adhesive composition may have an excellent light transmittance with respect to a visible-ray region. In one example, the pressure-sensitive adhesive composition of the present invention is formed in a film and may have a light transmittance of 85% or more with respect to the visible-ray region. For example, the pressure-sensitive adhesive composition is formed in a film and may have a light transmittance of 85%, 87%, or 90% or more with respect to the visible-ray region. In addition, the pressure-sensitive adhesive composition of the present invention may have a low haze with the excellent light transmittance. In one example, the pressure-sensitive adhesive composition may be formed in a film and have a haze of 3%, 2%, 1%, 0.8%, 0.5%, or 0.3% or less. That is, the pressure-sensitive adhesive composition of the present invention may realize excellent optical characteristics as well as reliability at high temperature and high humidity by satisfying the gel content and micro gel content according to Equations 1 and 2 as described above.

The pressure-sensitive adhesive composition of the present invention may be formed using known various materials as long as satisfying the physical properties.

For example, the pressure-sensitive adhesive composition may include an encapsulating resin and a multifunctional active energy ray-polymerizable compound that can be polymerized by irradiation of an active energy ray.

In an exemplary embodiment of the present invention, the encapsulating resin may have a glass transition temperature of less than 0, −10, −30, −50, or −60° C. Here, the glass transition temperature may refer to a glass transition temperature after a UV ray is irradiated at a dose of approximately 1 J/cm² or more, or a glass transition temperature after thermal curing is additionally performed after UV irradiation.

In one example, the encapsulating resin may include a styrene-based resin or an elastomer, a polyolefin-based resin or an elastomer, other elastomers, a polyoxyalkylene-based resin or an elastomer, a polyester-based resin or an elastomer, a polyvinylchloride-based resin or an elastomer, a polycarbonate-based resin or an elastomer, a polyphenylenesulfide-based resin or an elastomer, a mixture of hydrocarbon, a polyamide-based resin or an elastomer, an acrylate-based resin or an elastomer, an epoxy-based resin or an elastomer, a silicon-based resin or an elastomer, a fluorine-based resin or an elastomer, or a mixture thereof.

Here, the styrene-based resin or an elastomer may be, for example, a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer, or a mixture thereof. The olefin-based resin or an elastomer may be, for example, a high density polyethylene-based resin or an elastomer, a low density polyethylene-based resin or an elastomer, a polypropylene-based resin or an elastomer, or a mixture thereof. The elastomer may be, for example, an ester-based thermoplastic elastomer, an olefin-based elastomer, a silicon-based elastomer, an acrylic elastomer, or a mixture thereof. Among these, the olefin-based thermoplastic elastomer may be a polybutadiene resin or an elastomer or a polyisobutylene resin or an elastomer. The polyoxyalkylene-based resin or an elastomer may be, for example, a polyoxymethylene-based resin or an elastomer, a polyoxyethylene-based resin or an elastomer, or a mixture thereof. The polyester-based resin or an elastomer may be, for example, a polyethylene terephthalate-based resin or an elastomer, a polybutylene terephthalate-based resin or an elastomer, or a mixture thereof. The polyvinylchloride-based resin or an elastomer may be, for example, polyvinylidene chloride. The mixture of hydrocarbon may be, for example, hexatriacontane or paraffin. The polyamide-based resin or an elastomer may be, for example, nylon. The acrylate-based resin or an elastomer may be, for example, polybutyl(meth)acrylate. The epoxy-based resin or an elastomer may be, for example, a bisphenol-type such as a bisphenol A-type, a bisphenol F-type, a bisphenol S-type, and a hydrogenated product thereof; a novolac-type such as a phenolnovolac-type or a cresolnovolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as a dicyclopentadiene-type; an ester-type; an etherester-type; or a mixture thereof. The silicon-based resin or an elastomer may be, for example, polydimethylsiloxane. In addition, the fluorine-based resin or an elastomer may be a polytrifluoroethylene resin or an elastomer, a polytetrafluoroethylene resin or an elastomer, a polychlorotrifluoroethylene resin or an elastomer, a polyhexafluoropropylene resin or an elastomer, polyvinylidene fluoride, polyvinyl fluoride, polyethylenepropylene fluoride, or a mixture thereof.

The above-listed resins or elastomers may be grafted to, for example, maleic anhydride, copolymerized with another one of the listed resins or elastomers or a monomer for preparing the resin or elastomer, or modified by a compound, other than the above-used resins or elastomers. The compound may be a carboxyl-terminated butadiene-acrylonitrile copolymer.

In one example, the pressure-sensitive adhesive composition is an encapsulating resin, which may include an olefin-based elastomer, a silicon-based elastomer, or an acrylic elastomer of the above-described types, but the present invention is not limited thereto.

Specifically, the encapsulating resin may be a copolymer of a diene and an olefin-based compound having one carbon-carbon double bond. Here, the olefin-based compound may include isobutylene, propylene, or ethylene, and the diene may be a monomer capable of being polymerized with the olefin-based compound, for example, 1-butene, 2-butene, isoprene, or butadiene. That is, the encapsulating resin of the present invention may be, for example, a homopolymer of an isobutylene monomer; a copolymer prepared by copolymerizing an isobutylene monomer with a monomer capable of being polymerized therewith; or a mixture thereof. In one example, the copolymer of the diene and the olefin-based compound having one carbon-carbon double bond may be a butyl rubber. When a specific resin is used as described above, moisture barrier ability that would be achieved in the present invention may be satisfied. In addition, the present invention may improve humidity resistance and heat resistance by introducing various crosslinking structures and realizing specific gel content and micro gel content since a conventional isobutylene polymer has a low moisture permeability but has low heat resistance.

In the pressure-sensitive adhesive composition, the resin or elastomer component may have a weight average molecular weight (Mw) to an extent that the pressure-sensitive adhesive composition can be plasticized in a film type. For example, the resin or elastomer may have a weight average molecular weight (Mw) of approximately 100,000 to 2,000,000, 100,000 to 1,500,000, or 100,000 to 1,000,000. The term "weight average molecular weight" used herein refers to a converted value with respect to standard polystyrene measured by gel penetration chromatography (GPC). However, the resin or elastomer component does not necessarily have the above-mentioned weight average molecular weight. For example, when a molecular weight of the resin or elastomer component is not sufficient for forming a film, a separate binder resin may be blended in the pressure-sensitive adhesive composition.

The pressure-sensitive adhesive composition of the present invention may include, as described above, an active energy ray-polymerizable compound having high compatibility with the encapsulating resin and capable of forming a specific crosslinking structure with the encapsulating resin. In one exemplary embodiment, the crosslinking structure may be a crosslinking structure formed by application of heat, a crosslinking structure formed by irradiation of an active energy ray, or a crosslinking structure formed by aging at room temperature. Here, in the category of the "active energy ray", a microwave, an infrared (IR) ray, an ultraviolet (UV) ray, an X ray, and a gamma ray, and a particle beam such as an alpha-particle beam, a proton beam, a neutron beam, or an electron beam, and conventionally, an UV ray or an electron beam may be included.

For example, the pressure-sensitive adhesive composition of the present invention may include a multifunctional active energy ray-polymerizable compound that can be polymerized by irradiation of an active energy ray with the encapsulating resin. The active energy ray-polymerizable compound may refer to, for example, a compound including at least two of functional groups that can participate in a polymerization reaction by irradiation of an active energy ray, for example, a functional group including an ethylene-like unsaturated double bond such as an acryloyl group or a methacryloyl group, and a functional group such as an epoxy group or an oxetane group.

As the multifunctional active energy ray-polymerizable compound, for example, a multifunctional acrylate (MFA) may be used.

In addition, the multifunctional active energy ray-polymerizable compound that can be polymerized by the irradiation of an active energy ray may satisfy Formula 1. In addition, the active energy ray-polymerizable compound may be included at 5 to 30, 5 to 25, 8 to 20, 10 to 18, or 12 to 18 parts by weight relative to 100 parts by weight of the encapsulating resin.

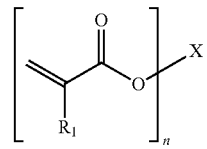

[Formula 1]

In Formula 1, $R_1$ is hydrogen or an alkyl group having 1 to 4 carbon atoms, n is an integer of 2 or more, and X is a residue induced from a linear, branched, or cyclic alkyl group having 3 to 30 carbon atoms. Here, when X is a residue induced from a cyclic alkyl group, X may be, for example, a residue induced from a cyclic alkyl group having 3 to 30, 6 to 28, 8 to 22, or 12 to 20 carbon atoms. In addition, when X is a residue induced from a linear alkyl group, X may be a residue induced from a linear alkyl group having 3 to 30, 6 to 25, or 8 to 20 carbon atoms. In addition, when X is a residue induced from a branched alkyl group, X may be a residue induced from a branched alkyl group having 3 to 30, 5 to 25, or 6 to 20 carbon atoms.

The term "residue induced from an alkyl group" used herein may refer to a residue of a specific compound composed of an alkyl group. In one example, in Formula 1, when n is 2, X may be an alkylene group. In addition, when n is 3 or more, at least two hydrogens of the alkyl group may be released from X, and then bind to a (meth)acryloyl group of Formula 1.

The term "alkyl group" used herein may refer to, but is not particularly defined otherwise, an alkyl group having 1 to 30, 1 to 25, 1 to 20, 1 to 16, 1 to 12, 1 to 8, or 1 to 4 carbon atoms. The alkyl group may have a linear, branched, or cyclic structure, and may be optionally substituted by at least one substituent.

The term "alkylene group" used herein may be, but is not particularly defined otherwise, an alkylene group having 2 to 30, 2 to 25, 2 to 20, 2 to 16, 2 to 12, 2 to 10, or 2 to 8 carbon atoms. The alkylene group may have a linear, branched, or cyclic structure, and may be optionally substituted by at least one substituent.

The multifunctional active energy ray-polymerizable compound that can be polymerized by the irradiation of an active energy ray may be any one satisfying Formula 1 without limitation. For example, the compound may be 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-dimethanol di(meth)acrylate, tricyclodecanedimethanol (meth)diacrylate, dimethylol dicyclopentane di(meth)acrylate, neopentyl glycol modified trimethylpropane di(meth)acrylate, adamantane di(meth)acrylate, trimethylolpropane tri(meth)acrylate, or a mixture thereof.

As the multifunctional active energy ray-polymerizable compound, for example, a compound having a molecular weight of less than 1,000 and including at least two functional groups may be used. In this case, the molecular weight may refer to a weight average molecular weight or a conventional molecular weight. A cyclic structure included in the multifunctional active energy ray-polymerizable compound may be any one of a carbocyclic structure, a heterocyclic structure, a monocyclic structure, and a polycyclic structure.

In one exemplary embodiment of the present invention, the pressure-sensitive adhesive composition may include a silane compound satisfying Formula 2:

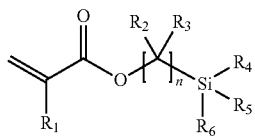

[Formula 2]

In Formula 2, $R_1$ is hydrogen or an alkyl group. $R_1$ may be, for example, an alkyl group having 1 to 4 or 1 to 2 carbon atoms. In addition, in Formula 2, $R_2$ and $R_3$ are each independently hydrogen, or a linear, branched, or cyclic alkyl group, or $R_2$ is linked with $R_3$, thereby forming a cyclic alkyl group. For example, $R_2$ and $R_3$ may be each independently hydrogen, or a linear, branched, or cyclic alkyl group. Here, the linear alkyl group may have 1 to 10, 1 to 6, or 1 to 4 carbon atoms, the branched alkyl group may have 3 to 10, 3 to 6, or 3 to 4 carbon atoms, and the cyclic alkyl group may have 3 to 10, 3 to 8, 3 to 6, or 3 to 4 carbon atoms. In addition, $R_2$ may be linked with $R_3$, thereby forming a cyclic alkyl group having 2 to 10, 3 to 10, 4 to 9, or 4 to 8 carbon atoms. In addition, in Formula 2, $R_4$, $R_5$, and $R_6$ are each independently hydrogen, an alkyl group, or an alkoxy group, at least one of $R_4$, $R_5$, and $R_6$ is an alkoxy group, and n is an integer of 1 or more. Particularly, $R_4$, $R_5$, and $R_6$ are each independently an alkyl group having 1 to 10, 1 to 6, 1 to 4, or 1 to 2 carbon atoms; or an alkoxy group having 1 to 10, 1 to 8, 1 to 4, or 1 to 2 carbon atoms. Here, at least one of $R_4$, $R_5$, and $R_6$ may be an alkoxy group, and all of $R_4$, $R_5$, and $R_6$ may be alkoxy groups, but the present invention is not limited thereto.

The term "alkoxy group" used herein may be, unless particularly defined otherwise, an alkoxy group having 1 to 20, 1 to 16, 1 to 12, 1 to 8, or 1 to 4 carbon atoms. The alkoxy group may be a linear, branched, or cyclic type. In addition, the alkoxy group may be optionally substituted by at least one substituent.

In one example, the silane compound is not particularly limited, as long as it satisfies Formula 2, and may be, for example, 3-methacryloxypropyl trimethoxysilane, 3-methacryloxy propyl triethoxysilane, 3-acryloxy propyl trimethoxysilane, 3-acryloxy propyl triethoxysilane, 3-methacryloxy methyl triethoxysilane, 3-methacryloxy methyl trimethoxysilane, 3-acryloxy propyl methyldimethoxysilane, methacryloxy methyl methyldimethoxysilane, methacryloxy methyl methyldiethoxysilane, methacryloxy propyl methyldimethoxysilane, methacryloxy propyl methyldiethoxysilane, methacryloxy propyl dimethylmethoxysilane, or methacryloxy propyl dimethylethoxysilane. An acryl group of the silane compound may serve to increase an interface pressure-sensitive adhesive strength by being crosslinked with the encapsulating resin or active energy ray-polymerizable compound of the pressure-sensitive adhesive composition. The silane compound may be included at, for example, 0.1 to 10, 0.5 to 8, 0.8 to 5, 1 to 5, 1 to 4.5, or 1 to 4 parts by weight relative to 100 parts by weight of the encapsulating resin.

In one example, the active energy ray-polymerizable compound may form a crosslinking structure with the silane compound satisfying Formula 2, and the crosslinking structure may form a semi-interpenetrating polymer network (semi-IPN) with the encapsulating resin. That is, the pressure-sensitive adhesive composition may include a semi-IPN. The term "semi-IPN" includes at least one polymer crosslinking structure (polymer network) and at least one linear or branched polymer, and at least a part of the linear or branched polymer has a structure penetrated into the polymer crosslinking structure. The semi-IPN may be distinguished from an IPN structure in that the linear or branched polymer can be theoretically separated from the polymer crosslinking structure without loss of a chemical bond.

In one exemplary embodiment, the crosslinking structure may be a crosslinking structure formed by application of heat, a crosslinking structure formed by irradiation of an active energy ray, or a crosslinking structure formed by aging at room temperature. Here, in the category of the "active energy ray", a microwave, an infrared (IR) ray, an ultraviolet (UV) ray, an X ray, and a gamma ray, and a particle beam such as an alpha-particle beam, a proton beam, a neutron beam, or an electron beam, and conventionally, an UV ray and an electron beam may be included. As such a semi-IPN structure is introduced, a mechanical property such as processability of the pressure-sensitive adhesive composition may be increased, humidity-resistant adhesive performance is improved, transparency is realized, and high moisture barrier performance and an excellent panel life span that cannot be achieved so far may be realized.

In one example, the active energy ray-polymerizable compound may form a crosslinking structure with the silane compound satisfying Formula 2, and the encapsulating resin may form a crosslinking structure with the active energy ray-polymerizable compound or the silane compound satisfying Formula 2, thereby forming an interpenetrating polymer network (IPN) structure. In addition, the term "IPN structure" refers to a state in which at least two crosslinking structures are present in a pressure-sensitive adhesive. In one example, the IPN structure may refer to a structure including at least two crosslinking structures in an intertwining, entanglement, or penetrating state. For example, the composition of the present invention may include a crosslinking structure by an encapsulating resin (hereinafter, referred to as a "first crosslinking structure") and a crosslinking structure formed by a reaction of an active energy ray-polymerizable compound and the silane compound satisfying Formula 2 (hereinafter, referred to as a "second crosslinking structure"), and the first and second crosslinking structures may be in a penetrating state or an entanglement state. That is, as the pressure-sensitive adhesive composition includes a semi-IPN or IPN structure in a crosslinked state, excellent durability and reliability of a pressure-sensitive adhesive may be realized under harsh conditions such as high temperature and high humidity by increasing a pressure-sensitive adhesive strength of a pressure-sensitive adhesive at high temperature and high humidity and preventing a decrease in an interface pressure-sensitive adhesive strength due to moisture penetration.

In an exemplary embodiment of the present invention, the pressure-sensitive adhesive composition may further include a radical initiator that can induce a polymerization reaction of the above-described active energy ray-polymerizable compound. The radical initiator may be a photoinitiator or a thermal initiator. A specific type of the photoinitiator may be suitably selected in consideration of a curing rate and possibility of yellowing. For example, as the photoinitiator, a benzoin-, hydroxy ketone-, amino ketone-, or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexylphenylketone, 2-methyl-1-[4-(methylthio)phenyl]-2-morpholino -propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-amino anthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide may be used.

The radical initiator may be included at 0.2 to 20 parts by weight relative to 100 parts by weight of the active energy ray-polymerizable compound. Accordingly, the reaction of the active energy ray-polymerizable compound is effectively induced, and degradation of physical properties of the pressure-sensitive adhesive composition due to remaining components after curing may be prevented.

In one example, the pressure-sensitive adhesive composition may further include a tackifier. The tackifier may be a hydrogenated annular olefin-based polymer. As the tackifier, for example, a hydrogenated petroleum resin obtained by hydrogenating a petroleum resin may be used. The hydrogenated petroleum resin may be partially or completely hydrogenated, and may be a mixture of such resins. Such a tackifier may have a high compatibility with the pressure-sensitive adhesive composition, excellent moisture barrier ability, and a small content of an organic volatile component. A specific example of the hydrogenated petroleum resin may be a hydrogenated terpene-based resin, a hydrogenated ester-based resin, or a hydrogenated dicyclopentadiene-based resin. The tackifier may have a weight average molecular weight of approximately 200 to 5,000. A content of the tackifier may be suitably controlled as needed. For example, the content of the tackifier may be selected in consideration of the gel content and micro gel content described above. According to one example, the tackifier may be included at 5 to 100 parts by weight relative to 100 parts by weight of a solid content of the pressure-sensitive adhesive composition.

The pressure-sensitive adhesive composition may further include a moisture absorbent when needed. The term "moisture absorbent" may refer to a material that can remove moisture or vapor penetrated into a pressure-sensitive adhesive film to be described below through a chemical reaction. When the pressure-sensitive adhesive composition of the present invention includes a moisture absorbent, a light transmittance to be described below may not be satisfied in the formation in a film, but instead, excellent moisture barrier ability may be realized. Specifically, the pressure-sensitive adhesive composition may be formed in a film to be applied to encapsulation of an organic electronic device. In this case, when the pressure-sensitive adhesive composition does not include a moisture absorbent and exhibits excellent transparency, it may be applied to encapsulation of a top-emissive organic electronic device, or when the pressure-sensitive adhesive composition includes a moisture absorbent and exhibits excellent moisture barrier ability, it may be applied to encapsulation of a bottom-emissive organic electronic device. However, the present invention is not limited thereto. That is, when the pressure-sensitive adhesive composition does not include a moisture absorbent and exhibits excellent transparency, it may be applied to encapsulation of a bottom-emissive organic electronic device.

For example, the moisture absorbent may be present while being uniformly dispersed in the pressure-sensitive adhesive composition or a pressure-sensitive adhesive layer to be described below. Here, the uniformly dispersed state may mean a state in which the moisture absorbent is present even in any part of the pressure-sensitive adhesive composition or the pressure-sensitive adhesive layer at the same or substantially the same density. As the moisture absorbent used herein, for example, a metal oxide, a sulfate, or an organic metal oxide may be used. Specifically, the sulfate may be magnesium sulfate, sodium sulfate, or nickel sulfate, and the organic metal oxide may be aluminum oxide octylate. Here, the metal oxide may be phosphorus pentoxide ($P_2O_5$), lithium oxide ($Li_2O$), sodium oxide ($Na_2O$), barium oxide (BaO), calcium oxide (CaO), or magnesium oxide (MgO), and the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$), but the present invention is not limited thereto. As the moisture absorbent that can be included in the pressure-sensitive adhesive composition, one or at least two of the above-described materials may be used. In one example, when at least two of the above materials are used, the moisture absorbent may be calcined dolomite.

Such a moisture absorbent may be controlled in a suitable size according to its use. In one example, an average diameter of the moisture absorbent may be controlled to approximately 10 to 15000 nm. A moisture absorbent having the above range of the average diameter may be easily stored due to a not too high reaction speed with moisture, and may effectively remove moisture without damage to an element to be encapsulated.

A content of the moisture absorbent may be suitably selected without particular limitation in consideration of a desired barrier characteristic.

The pressure-sensitive adhesive composition may further include a moisture blocker when needed. The term "moisture blocker" used herein may refer to a material that can block or prevent migration of moisture or vapor in a film while having no or low reactivity with moisture. As the moisture blocker, one or at least two of clay, talc, pin-type silica, planar silica, porous silica, zeolite, titania, and zirconia may be used. In addition, a surface of the water blocker may be treated with an organic modifier to facilitate penetration of an organic material. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium, or a mixture thereof may be used.

A content of the moisture blocker may be suitably selected without particular limitation in consideration of a desired blocking characteristic.

In addition to the above-described components, various additives may be included in the pressure-sensitive adhesive composition according to its use and a process of manufacturing a pressure-sensitive adhesive film that will be described below. For example, the pressure-sensitive adhesive composition may include a curable material, a crosslinking agent, or a filler at a suitable range of content according to a desired physical property.

In another aspect, the present invention provides a pressure-sensitive adhesive film. In addition, the pressure-sensitive adhesive film may include a pressure-sensitive adhesive layer formed of the above-described pressure-sensitive adhesive composition or a crosslinked product thereof. The pressure-sensitive adhesive layer may also be formed in a film or sheet. Such a pressure-sensitive adhesive layer may be used to encapsulate an organic electronic element.

In an exemplary embodiment of the present invention, the pressure-sensitive adhesive layer may be formed in a monolayer structure as described above, or may be formed of at least two layers that will be described below. For example, the pressure-sensitive adhesive layer may include a first layer containing the above-described pressure-sensitive adhesive composition or a crosslinked product thereof and a second layer including a pressure-sensitive adhesive resin or an adhesive resin. The pressure-sensitive adhesive resin or adhesive resin included in the second layer may be the same as or different from the above-described encapsulating resin, and may be suitably selected by a conventional technician according to a purpose. In addition, the first and second layers may or may not include a moisture absorbent.

In one example, the pressure-sensitive adhesive resin included in the second layer may include a curable resin including at least one heat-curable functional group such as a glycidyl group, an isocyanate group, a hydroxyl group, a carboxyl group, or an amide group, or at least one electromagnetic wave-curable functional group such as an epoxide group, a cyclic ether group, a sulfide group, an acetal group, or a lactone group, which may be cured to exhibit an adhesive characteristic. In addition, a specific type of such a resin may be, but is not limited to, an acryl resin, a polyester resin, an isocyanate resin, or an epoxy resin.

In the present invention, as the curable resin, an aromatic or aliphatic, or linear or branched epoxy resin may be used. In one exemplary embodiment of the present invention, an epoxy resin containing at least two functional groups and having an epoxy equivalent of 180 to 1,000 g/eq may be used. When the epoxy resin having the above range of epoxy equivalent is used, characteristics of the cured product such as adhesive performance and a glass transition temperature may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene modified phenol-type epoxy resin.

In an exemplary embodiment of the present invention, the second layer may include another component such as an active energy ray-polymerizable compound, a radical initiator, a tackifier, a moisture absorbent, a moisture blocker, a dispersing agent, or a silane compound, which may be the same as or different from that of the first layer, in addition to the above-described resin. In addition, the second layer may include a curable material, a curing agent, or a filler at a suitable range of content according to a desired physical property.

A sequence of laminating the first and second layers is not particularly limited, and thus the second layer may be formed on the first layer, or the first layer may be formed on the second layer.

In one example, the pressure-sensitive adhesive film may include a barrier film on one surface of the pressure-sensitive adhesive layer. The barrier film may be formed of any material generally used in the art without limitation. For example, here, the barrier film may include a base layer, an organic undercoating layer, an inorganic deposition layer, and an organic top-coating layer, and the organic top-coating layer may be in contact with the pressure-sensitive adhesive layer.

The pressure-sensitive adhesive film may have a water vapor transmission rate (WVTR) measured with respect to a thickness direction of the film while being formed in a film having a thickness of 10 μm of 50, 40, 30, 20, or 10 g/m$^2$·day or less at 100° F. and a relative humidity of 100%. By controlling a composition or crosslinking condition of a pressure-sensitive adhesive layer including a pressure-sensitive adhesive composition to have such a WVTR, an encapsulation or capsulation structure which can stably protect an element by effectively blocking moisture or oxygen penetrated from an external environment when being applied to an encapsulation or capsulation structure of an electronic device may be realized. The lower WVTR, the better moisture barrier ability, and therefore the lower limit of the WVTR may be, but is not particularly limited to, 0 g/m$^2$·day.

In addition, the pressure-sensitive adhesive film may have an excellent light transmittance with respect to a visible-ray region. In one example, the pressure-sensitive adhesive film of the present invention may have a light transmittance of 85% or more with respect to the visible-ray region. For example, the pressure-sensitive adhesive film may have a light transmittance of 85%, 87%, or 90% or more with respect to the visible-ray region. In addition, the pressure-sensitive adhesive film of the present invention may have a low haze with the excellent light transmittance. In one example, the pressure-sensitive adhesive film may have a haze of 3%, 2%, 1%, 0.8%, 0.5%, or 0.3% or less. That is, the pressure-sensitive adhesive film according to the present invention may realize excellent optical characteristics as well as reliability at high temperature and high humidity by satisfying the gel content and micro gel content according to Equations 1 and 2 as described above.

The pressure-sensitive adhesive film may further include a base film or release film (hereinafter, can be referred to as a "first film"), and the pressure-sensitive adhesive layer may be formed on the base or release film. The structure may further include a base or release film formed on the pressure-sensitive adhesive layer (hereinafter, can be referred to as a "second film").

FIGS. 1 and 2 are cross-sectional views of exemplary pressure-sensitive adhesive films.

A pressure-sensitive adhesive film 1, as shown in FIG. 1, may include a pressure-sensitive adhesive layer 11 formed on a base or release film 12. Another exemplary pressure-sensitive adhesive film 2, as shown in FIG. 2, may further include a base or release film 21 formed on a pressure-sensitive adhesive layer 11. Although not shown in FIGS. 1 and 2, the pressure-sensitive adhesive film may also have the pressure-sensitive adhesive composition without a supporting base such as a base or release film, and therefore have a structure only including a pressure-sensitive adhesive layer formed in a film or sheet maintaining a solid phase or a semi-solid phase at room temperature, or a structure in which a pressure-sensitive adhesive layer is formed on both surfaces of one base or release film.

A specific type of the first film is not particularly limited. As the first film, for example, a plastic film may be used. The first film may be a polyethyleneterephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, or a polyimide film.

When the first film is a release film, suitable release treatment may be performed on one or both surfaces of such a plastic film. As a releasing agent used for release treatment, an alkyd-based releasing agent, a silicon-based releasing agent, a fluorine-based releasing agent, an unsaturated ester-based releasing agent, a polyolefin-based releasing agent, or a wax-based releasing agent may be used. In consideration of heat resistance, an alkyd-based releasing agent, a silicon-based releasing agent, or a fluorine-based releasing agent among the above examples is conventionally used, but the present invention is not limited thereto.

As the first film, for example, a plastic film in which a gas barrier layer is formed on a top or side surface of a base may be used. Such a film may directly constitute, for example, a substrate of an organic electronic device to be used for realizing a flexible element.

A type of the second film is not particularly limited, either. For example, as the second film, within the category of the first film listed above, one that is the same as or different from the first film may be used.

A thickness of the first or second film is not particularly limited. In one example, the thickness of the first film may be approximately 50 to 500 or 100 to 200 µm. In such a range, a process of preparing or manufacturing a pressure-sensitive adhesive or an organic electronic device may be effectively automated, and advantageous effects in economic feasibility may be achieved.

The thickness of the second film is not particularly limited, either. For example, the thickness of the second film may be the same as, or relatively smaller or larger than that of the first film.

The pressure-sensitive adhesive layer of the pressure-sensitive adhesive film includes the pressure-sensitive adhesive composition, and is formed in a film or sheet. In the pressure-sensitive adhesive layer, the pressure-sensitive adhesive composition may be in a crosslinked or non-crosslinked state. The pressure-sensitive adhesive layer may be in a solid or semi-solid phase at room temperature. A curable pressure-sensitive adhesive resin included in the pressure-sensitive adhesive layer in a sold or semi-sold phase may be in a non-crosslinked state. Such a pressure-sensitive adhesive resin may form a crosslinking structure in an encapsulation structure of an organic electronic element, which will be described below.

A thickness of the pressure-sensitive adhesive layer is not particularly limited, and in consideration of its uses, may be suitably selected. For example, the pressure-sensitive adhesive layer may have a thickness of approximately 5 to 200 µm. The thickness of the pressure-sensitive adhesive layer may be controlled in consideration of, for example, embeddability when being used as an encapsulant of an organic electronic element and processability or economic feasibility.

In still another aspect, the present invention provides a method of manufacturing a pressure-sensitive adhesive film. The exemplary pressure-sensitive adhesive film may be manufactured by plasticizing the pressure-sensitive adhesive composition in a film or sheet.

In one example, the method may include applying a coating solution including the pressure-sensitive adhesive composition on a base or release film in a sheet or film, and drying the applied coating solution. The method may further include adhering an additional base or release film to the dried coating solution.

The coating solution including the pressure-sensitive adhesive composition may be prepared by, for example, dissolving or dispersing components of each pressure-sensitive adhesive composition described above in a suitable solvent. In one example, the pressure-sensitive adhesive composition may be prepared by dissolving or dispersing the moisture absorbent, blocker, or filler in a solvent when needed, grinding the resulting product, and mixing the ground moisture absorbent, blocker, or filler with an encapsulating resin.

A type of a solvent used in preparation of the coating solution is not particularly limited. However, when time to dry the solvent is too long, or it is necessary to dry the solvent at a high temperature, there may have some problems in workability or durability of a pressure-sensitive adhesive film. For this reason, a solvent having a volatile temperature of 150° C. or less may be used. In consideration of film moldability, a small amount of the solvent having the above range of the volatile temperature may be used. The solvent may be, but is not limited to, one or at least two of methylethylketone (MEK), acetone, toluene, dimethyl formamide (DMF), methyl cellosolve (MCS), tetrahydrofuran (THF), xylene, and N-methylpyrrolidone (NMP).

A method of applying the coating solution to the base or release film may be, but is not particularly limited to, a known coating method such as knife coating, roll coating, spray coating, gravure coating, curtain coating, comma coating, or lip coating.

The applied coating solution may be dried to volatilize the solvent, thereby forming a pressure-sensitive adhesive layer. The drying may be performed, for example, at 70 to 150° C. for 1 to 10 minutes. The drying condition may be changed in consideration of a type of the used solvent.

After drying, an additional base or release film may be formed on the pressure-sensitive adhesive layer.

In yet another aspect, the present invention provides a product for encapsulating an organic electronic device. The product for encapsulating an organic electronic device may include a substrate; an organic electronic element formed on the substrate; and a pressure-sensitive adhesive film encapsulating an entire surface, for example, both top and side surfaces of the organic electronic element. The pressure-sensitive adhesive film may include a pressure-sensitive adhesive layer containing a pressure-sensitive adhesive composition in a crosslinked state. The product for encapsulating an organic electronic device may further include a cover substrate formed on a top surface of the pressure-sensitive adhesive layer.

Here, the organic electronic element may be, for example, an organic light emitting element, and in one example, may be a top-emissive organic light emitting element.

In yet another aspect, the present invention provides a method of manufacturing an organic electronic device. The product for encapsulating an organic electronic device may be manufactured using, for example, the pressure-sensitive adhesive film.

The pressure-sensitive adhesive layer may be formed as an encapsulating layer for effectively fixing and supporting the substrate and a cover substrate, while exhibiting excellent moisture barrier property and optical property.

In addition, the pressure-sensitive adhesive layer may exhibit excellent transparency, and may be stable regardless of a type of the organic electronic device, for example, a top-emissive or bottom-emissive organic electronic device.

The term "encapsulating layer" used herein may refer to a pressure-sensitive adhesive layer covering both top and side surfaces of the organic electronic element.

FIG. 3 is a schematic diagram of an exemplary organic electronic device in which an organic electronic element is an organic light emitting element.

To manufacture the organic electronic device, for example, applying the above-described pressure-sensitive adhesive film to the substrate on which the organic electronic element is formed in order to cover the organic electronic element; and curing the pressure-sensitive adhesive film may be included.

The term "curing" used herein may refer to preparing a pressure-sensitive adhesive by forming the pressure-sensitive adhesive composition of the present invention to have a crosslinking structure through heating or UV irradiation.

Particularly, an organic electronic element 32 may be formed by forming a transparent electrode on a glass or polymer film 31 used as a substrate by a method such as vacuum deposition or sputtering, forming layers of emissive organic materials, composed of, for example, a hole transport layer, an emitting layer, and an electron transport layer on the transparent electrode, and further forming an electrode layer thereon. Subsequently, a pressure-sensitive adhesive layer of the pressure-sensitive adhesive film is disposed to cover an entire surface of the organic electronic element 32 of the substrate 31 which has gone through the above-described process.

Subsequently, an encapsulating layer may be formed by compressing the pressure-sensitive adhesive layer on the organic electronic element using a laminator while being heated to provide mobility, and crosslinking a resin in the pressure-sensitive adhesive layer.

In one example, the pressure-sensitive adhesive layer 33 disposed to cover an entire surface of the organic electronic element 32 may be previously transferred to a cover substrate 34 such as a glass or a polymer film. The transfer of the pressure-sensitive adhesive layer to the cover substrate 34 may be performed using a vacuum press or vacuum laminator while being heated after a first or second film is peeled off from the pressure-sensitive adhesive film and the pressure-sensitive adhesive layer is in contact with the cover substrate 34. When a pressure-sensitive adhesive includes a heat-curable pressure-sensitive adhesive resin and a curing reaction is excessively performed during the process, a cohesive strength or pressure-sensitive adhesive strength of the encapsulating layer is probably reduced. Therefore, a process temperature may be controlled to approximately 100° C. or less, and a process time may be controlled within 5 minutes.

An encapsulating layer may be formed by disposing the cover substrate 34 to which the pressure-sensitive adhesive layer is transferred on the organic electronic element 32, and performing the heat compression process.

An encapsulating layer may be formed by curing the pressure-sensitive adhesive layer 33. The curing process may be performed in a suitable heating chamber or UV chamber, for example, according to a method of curing a curable pressure-sensitive adhesive resin. A heating condition or a condition of irradiating an active energy ray may be suitably selected in consideration of stability of the organic electronic element and curability of the pressure-sensitive adhesive resin, and to increase compression efficiency, autoclaving may also be performed with application of heat and pressure at the same time.

Here, one example of the method of manufacturing an organic electronic device is described, but the organic electronic device may be manufactured by a different method. For example, the manufacture of the device is performed by the above-described method, but a sequence or condition of the process may be changed. For example, the encapsulating layer may be formed by previously transferring the pressure-sensitive adhesive layer to the substrate 31, not to the cover substrate 34, and performing a curing process while the cover substrate 34 is laminated.

EFFECTS

The present invention can provide a pressure-sensitive adhesive composition that can effectively block moisture or oxygen penetrated into an organic electronic device from an external environment, and exhibit reliability under harsh conditions such as high temperature and high humidity and excellent optical characteristics, and a pressure-sensitive adhesive film including the same.

Figure 1:
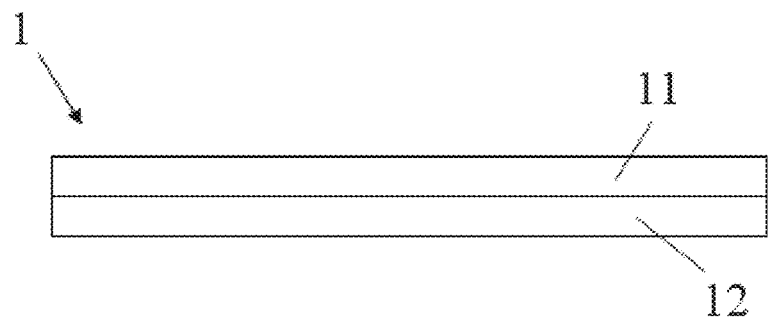
FIGS. 1 and 2 are cross-sectional views of pressure-sensitive adhesive films according to exemplary embodiments of the present invention.
Figure 2:
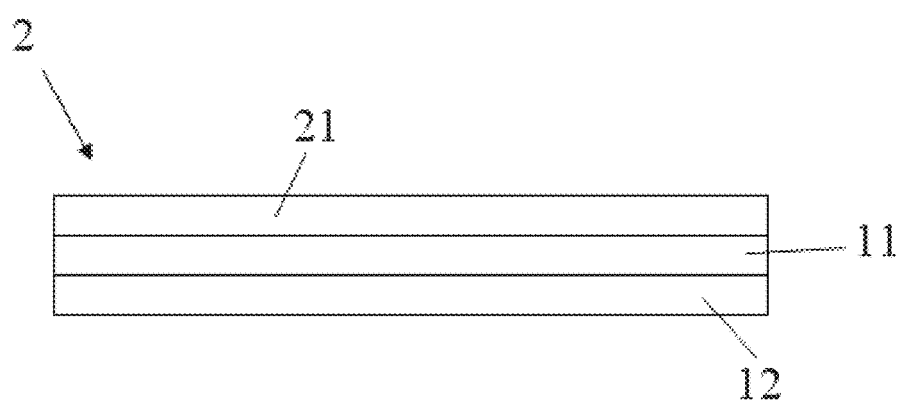
Figure 3:
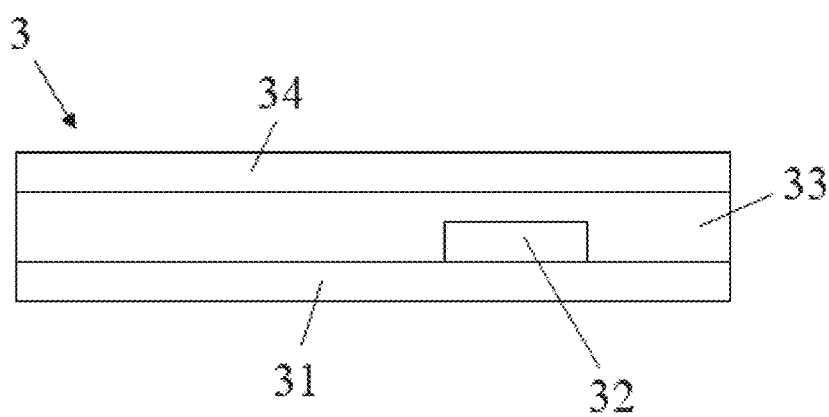
FIG. 3 is a cross-sectional view of a product for encapsulating an organic electronic device according to an exemplary embodiment of the present invention.
Figure 4:
FIG. 4 is a diagram showing results of a reliability test of a pressure-sensitive adhesive film according to Example 1 of the present invention.
Figure 5:
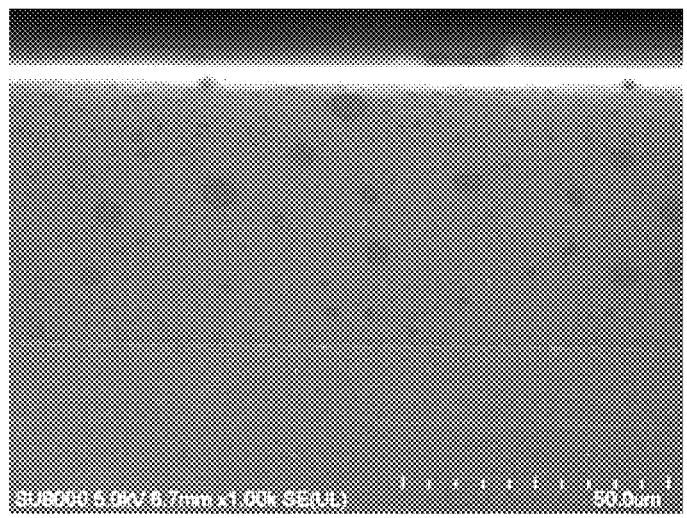
FIG. 5 is a diagram showing results of a reliability test of a pressure-sensitive adhesive film according to Comparative Example 1 of the present invention.

DESCRIPTION OF REFERENCE NUMERALS 1, 2: pressure-sensitive adhesive film
11: pressure-sensitive adhesive layer
12: first film
21: second film
3: organic electronic device
31: substrate
32: organic electronic element
33: pressure-sensitive adhesive layer or encapsulating layer
34: cover substrate

DETAILED DESCRIPTION OF EXEMPLARY EMBODIMENTS

Hereinafter, the present invention will be described in detail with reference to Examples and Comparative Examples, but the scope of the present invention is not limited to the following Examples.

Example 1

A coating solution was prepared by adding 90 g of a butyl rubber (LANXESS, BUTYL 301) as an encapsulating resin, 10 g of a hydrogenated DCPD-based tackifier resin (SU-90, Kolon) as a tackifier, 15 g of tricyclodecane dimethanol diacrylate (M262, Miwon) as an active energy ray-polymerizable compound, and 1 g of 2,2-dimethoxy-1,2-diphenylethane-1-one (Irgacure651, Ciba) as a radical initiator, and diluting the mixture in toluene to have a solid content of approximately 15 wt %.

The prepared solution was coated on a released surface of release PET, and dried in an oven at 100° C. for 15 minutes, thereby manufacturing a pressure-sensitive adhesive film including a pressure-sensitive adhesive layer having a thickness of 20 μm. Physical properties of the sample were measured after a UV ray was irradiated at 2 J/cm$^2$ on the manufactured film.

Example 2

A pressure-sensitive adhesive film was manufactured by the same method as described in Example 1, except that 60 g of a butyl rubber (LANXESS, BUTYL 301) and 30 g of polyisobutylene (including 25 g of BASF, B80, and 5 g of B15) were used as encapsulating resins.

Example 3

A pressure-sensitive adhesive film was manufactured by the same method as described in Example 1, except that CaO (Aldrich) was added as a moisture absorbent at 20 parts by weight relative to 100 parts by weight of a butyl rubber and a tackifier resin.

Comparative Example 1

A pressure-sensitive adhesive film was manufactured by the same method as described in Example 1, except that 80 g of polyisobutylene (BASF, B80) was used as an encapsulating resin, 2-hydroxyethyl acrylate (HEA, Aldrich) was added, and isophorone diisocyanate (IPDI, Aldrich) was added.

Comparative Example 2

A pressure-sensitive adhesive film was manufactured by the same method as described in Example 1, except that polybutadiene dimethacrylate (CN301, Sartomer) was used as an active energy ray-polymerizable compound.

Comparative Example 3

A pressure-sensitive adhesive film was manufactured by the same method as described in Example 1, except that a content of an active energy ray-polymerizable compound was changed to 3 g.

Comparative Example 4

A pressure-sensitive adhesive film was manufactured by the same method as described in Example 1, except that a content of an active energy ray-polymerizable compound was changed to 0 g.

Comparative Example 5

A coating solution (pressure-sensitive adhesive composition) was prepared by mixing 99 parts by weight of n-butyl acrylate and 1 part by weight of 2-hydroxyethyl methacrylate, and blending a multifunctional epoxy compound (trimethylolpropane triglycidylether), a cationic photoinitiator (triarylsulfonium hexafluoroantimonate), and γ-glycidoxypropyl trimethoxy silane in an acryl pressure-sensitive adhesive having a molecular weight (Mw) of approximately 1,800,000, and diluting the mixture at a suitable concentration. A pressure-sensitive adhesive layer was formed to have a thickness of approximately 50 μm by coating and drying the prepared coating solution on a release-treated surface of a polyethyleneterephthalate (PET) film on which release treatment was performed, and forming a crosslinking structure by irradiating a UV ray.

Comparative Example 6

A pressure-sensitive adhesive film was manufactured by the same method as described in Example 1, except that 80 g of polyisobutylene (BASF, B80) was used as an encapsulating resin instead of a butyl rubber, and 15 g of fumed silica (R812, Evonik) was added.

Hereinafter, physical properties were evaluated by the following methods in the Examples and Comparative Examples.

1. Gel Content

Gel content (wt %)=$B/A \times 100$

Here, A is a weight of the pressure-sensitive adhesive composition, and B is a dry weight of an insoluble content of the pressure-sensitive adhesive composition remaining after the pressure-sensitive adhesive composition was dipped in toluene at 60° C. for 24 hours and filtered through a 200-mesh sieve (pore size: 200 μm. In Comparative Example 5, ethyl acetate was used instead of toluene.

2. Micro Gel Content

Micro gel content (wt %)=$C/A \times 100$

Here, A is a weight of the pressure-sensitive adhesive composition, and C is a dry weight of the pressure-sensitive adhesive composition remaining after the pressure-sensitive adhesive composition was dipped in toluene at 60° C. for 24 hours, primarily filtered through a 200-mesh sieve (pore size: 200 μm), and secondarily filtered through a 1000-mesh sieve (pore size: 5 μm). In Comparative Example 5, ethyl acetate was used instead of toluene.

In addition, the micro gel could be detected using a 5 μm syringe. For example, when the pressure-sensitive adhesive composition was primarily filtered through a 200-mesh sieve (pore size: 200 μm) and passed through a 5 μm syringe, the pressure-sensitive adhesive composition having a micro gel content of more than 3% represented by Equation 2 did not pass since a syringe was clogged due to a micro gel (having a size of approximately 100 nm to 20 μm) present in the composition. When the composition was not filtered, it was represented as X in Table 1. On the other hand, when there was almost no or no micro gel, the composition passed through the syringe (represented as 0 in Table 1), and the micro gel content represented in Equation 2 was detected at 3% or less. In addition, through morphological analysis, the presence of the micro gel could be actually confirmed.

3. Water Vapor Transmission Rate (WVTR)

A resin composition was prepared by dissolving the resin used in Example or Comparative Example in a solvent. The resin composition was applied to a base film having a thickness of 38 μm (release polyester film, RS-21G, SKC). Subsequently, the composition was dried at 110° C. for 10 minutes, thereby forming a film-type layer having a thickness of 100 μm. Afterward, the base film was peeled, and then a WVTR of the film-type layer was measured in a thickness direction, while the layer was maintained at 100° F. and a relative humidity of 100%. The WVTR was measured according to a specification of ASTM F1249.

4. Evaluation of Reliability (1) A sample was prepared by laminating the film manufactured in Example or Comparative Example on a barrier film (serving as a cover substrate), laminating the resulting product between glass substrates, and pressure and heat-compressing the resulting product using an autoclave at 50° C. and 5 atm. Afterward, the sample was maintained in a constant temperature and constant humidity chamber at 85° C. and a relative humidity of 85% for approximately 500 hours, and observed whether lifting, bubbles, or hazes were generated at an interface between a glass substrate and a pressure-sensitive adhesive layer. When being viewed with the naked eye, at the interface between the glass substrate and the pressure-sensitive adhesive layer, if at least one lifting, bubble, or haze was generated, it was represented as X, and if no lifting, bubble, or haze was generated, it was represented as O.

(2) A sample was manufactured by the same method, except that a polarizing plate was further laminated on a barrier film in a method of evaluating reliability at 85° C. and a relative humidity of 85%, and observed to check whether lifting or bubbles were generated at an interface between a glass substrate and a pressure-sensitive adhesive layer while being maintained in a 80° C. chamber for approximately 500 hours. When being viewed with a naked eye, if there was at least one lifting or bubble at the interface between the glass substrate and the pressure-sensitive adhesive layer, it was represented as X, and if there was no lifting or bubble, it was represented as O.

5. Measurement of Light Transmittance and Haze

A light transmittance of the pressure-sensitive adhesive film manufactured as described above was measured at 550 nm using a UV-Vis spectrometer, and a haze of the pressure-sensitive adhesive film was measured using a haze meter according to a standard test method of JIS K7105.

wherein the pressure-sensitive adhesive film comprises a pressure-sensitive adhesive layer including a cross-linked pressure-sensitive adhesive composition, wherein the pressure-sensitive adhesive composition comprises an encapsulating resin and a multifunctional active energy ray-polymerizable compound, wherein the encapsulating resin is a butyl rubber, wherein the multifunctional active energy ray-polymerizable compound satisfies following formula:

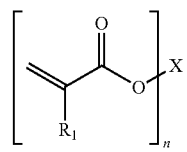

where $R_1$ is hydrogen or an alkyl group having 1 to 4 carbon atoms, n is an integer of 2 or more, and X is a residue induced from a linear, branched, or cyclic alkyl group having 3 to 30 carbon atoms, wherein the multifunctional active energy ray polymerizable compound is included at 5 to 18 parts by weight relative to 100 parts by weight of the encapsulating resin, and wherein the pressure-sensitive adhesive composition has a gel content represented by Equation 1 of 50% or more, a micro gel content represented by Equation 2 of 3% or less, and a water vapor transmission rate in a thickness direction while being formed in a film of 50 g/m²·day or less, wherein the water vapor transmission rate is measured according to a specification of ASTM F1249:

Gel content (wt %)=$B/A$×100     [Equation 1]

Micro gel content (wt %)=$C/A$×100     [Equation 2]

wherein in Equations 1 and 2, A is a mass of the pressure-sensitive adhesive composition,

TABLE 1

| | Gel % | Micro gel | | WVTR g/m²·day | High temperature & high humidity reliability 85° C. 85% RH | High temperature reliability 80° C., Polarizing plate | Light transmittance % | Haze |
|---|---|---|---|---|---|---|---|---|
| | | % | O/X (5 μm syringe) | | | | | |
| Example 1 | 74 | 0 | O | 4 | O | O | 90 | 0.2 |
| Example 2 | 51 | 0 | O | 4 | O | O | 90 | 0.2 |
| Example 3 | 85 | 0 | O | 6 | O | O | — | — |
| Comparative Example 1 | 55 | 4.1 | X | 4 | O | X | 90 | 2.7 |
| Comparative Example 2 | 0 | 0 | O | 5 | X | X | 90 | 0.3 |
| Comparative Example 3 | 43 | 0 | O | 4 | O | X | 90 | 0.2 |
| Comparative Example 4 | 0 | 0 | O | 4 | X | X | 90 | 0.1 |
| Comparative Example 5 | 83 | 0 | O | >500 | O | O | 90 | 0.2 |
| Comparative Example 6 | 0 | 0 | O | 4 | O | X | 89 | 1.6 |

What is claimed is:

1. An organic electronic device, comprising:
a substrate;
an organic electronic element formed on the substrate; and
a crosslinked pressure-sensitive adhesive film encapsulating the organic electronic element, in Equation 1, B is a dry mass of an insoluble content of the pressure-sensitive adhesive composition remaining after being dipped in toluene at 60° C. for 24 hours and filtered through a 200-mesh sieve (pore size of 200 μm), and in Equation 2, C is a dry mass of an insoluble content of the pressure-sensitive adhesive composition remaining after being dipped in toluene at 60° C. for 24 hours, primarily filtered through a 200-mesh sieve (pore size: 200 μm), and secondarily filtered through a 1000-mesh sieve (pore size: 5 μm).

2. The organic electronic device according to claim 1, wherein the pressure-sensitive adhesive composition has a gel content represented by Equation 1 of 50 to 99%.

3. The organic electronic device according to claim 1, wherein the pressure-sensitive adhesive composition has a light transmittance of 85% or more with respect to a visible-ray region while being formed in a film.

4. The organic electronic device according to claim 1, wherein the pressure-sensitive adhesive composition has a haze of 3% or less while being formed in a film.

5. The organic electronic device according to claim 1, wherein the pressure-sensitive adhesive composition further comprises:
a tackifier.

6. The organic electronic device according to claim 1, wherein the pressure-sensitive adhesive composition further comprises:
a radical initiator.

7. The organic electronic device according to claim 1, wherein the pressure-sensitive adhesive composition further comprises:
a moisture absorbent.

8. The organic electronic device according to claim 1, wherein the pressure-sensitive adhesive layer comprises a first layer having the crosslinked pressure-sensitive adhesive composition and a second layer having a pressure-sensitive adhesive resin or an adhesive resin.

9. The organic electronic device according to claim 1, wherein the pressure-sensitive adhesive film has a light transmittance of 85% or more with respect to a visible-ray region.

10. The organic electronic device according to claim 1, wherein the pressure-sensitive adhesive film has a haze of 3% or less.

11. A method of manufacturing an organic electronic device of claim 1, comprising:
providing a substrate;
forming an organic electronic element on the substrate;
applying the pressure-sensitive adhesive film to the substrate on which the organic electronic element is formed in order to cover the organic electronic element; and
curing the pressure-sensitive adhesive film.

* * * * *